(12) United States Patent
Chen

(10) Patent No.: US 11,382,235 B2
(45) Date of Patent: Jul. 5, 2022

(54) FIXING BRACKET FOR SLIDE RAIL OF OPEN RACK

(71) Applicant: MARTAS PRECISION SLIDE CO., LTD., New Taipei (TW)

(72) Inventor: Wan-Lai Chen, New Taipei (TW)

(73) Assignee: MARTAS PRECISION SLIDE CO., LTD., New Taipei (TW)

(*) Notice: Subject to any disclaimer, the term of this patent is extended or adjusted under 35 U.S.C. 154(b) by 215 days.

(21) Appl. No.: 16/711,397

(22) Filed: Dec. 11, 2019

(65) Prior Publication Data
US 2021/0185849 A1   Jun. 17, 2021

(51) Int. Cl.
*H05K 7/18*   (2006.01)

(52) U.S. Cl.
CPC ..................... *H05K 7/18* (2013.01)

(58) Field of Classification Search
CPC  H05K 7/18; H05K 7/183; H05K 7/14; H05K 7/1461; F16M 11/041; A47B 88/43; G06F 1/18; G06F 1/183; G06F 1/187; G06F 1/188
USPC ..... 361/724, 725, 726, 727, 679.37, 679.38, 361/679.39; 248/298.1, 220.31, 316.8, 248/287.1, 295.11, 221.11, 243, 244, 245, 248/246, 220.22, 222.52, 224.8, 222.11, 248/222.12, 219.1; 312/223.1, 223.2, 312/223.3, 265.1, 265.2, 265.3, 265.4, 312/334.4, 334.5
See application file for complete search history.

(56) References Cited

U.S. PATENT DOCUMENTS

| 5,833,337 A * | 11/1998 | Kofstad | H05K 7/1421 312/334.5 |
| 6,554,142 B2 * | 4/2003 | Gray | A47B 57/30 211/175 |
| 6,578,939 B1 * | 6/2003 | Mayer | F16B 9/058 312/334.5 |
| 6,615,992 B1 * | 9/2003 | Lauchner | H05K 7/1489 211/175 |
| 7,494,101 B2 * | 2/2009 | Chen | A47B 88/43 211/192 |

(Continued)

FOREIGN PATENT DOCUMENTS

TW          447826          7/2001

OTHER PUBLICATIONS

"Top 7 Advantages of Progressive Die Metal Stamping Your Parts." Posted by Kevin Duffy on Apr. 23, 2013 for Manor Tool & Manufacturing Company. (Year: 2013).*

*Primary Examiner* — Eret C McNichols
*Assistant Examiner* — Michael McDuffie
(74) *Attorney, Agent, or Firm* — Fei-hung Yang

(57) ABSTRACT

A fixing bracket for a slide rail of an open rack includes a fixed cover, a sliding cover and plural fasteners. Both fixed and sliding covers cover the exterior of the slide rail, and the sliding cover can slide appropriately with limitation, and a pair of the slide rails are installed symmetrically on both sides of a chassis, and the fixing bracket is provided for fixing the chassis onto an open rack which is a rectangular enclosed frame structure similar to a door frame, and the fixed cover and the sliding cover have a first fixing plate and a second fixing plate configured to be corresponsive to the open rack. With a sliding design of the sliding cover, the fasteners can be used to fix the chassis onto the two opposite sides of the rack by adjusting the width of the open rack.

4 Claims, 4 Drawing Sheets

(56) References Cited

U.S. PATENT DOCUMENTS

| | | | | |
|---|---|---|---|---|
| 7,798,582 | B2* | 9/2010 | Yu | A47B 88/43 |
| | | | | 312/334.4 |
| 8,033,621 | B2* | 10/2011 | Liang | H05K 7/1489 |
| | | | | 312/334.4 |
| 8,721,012 | B2* | 5/2014 | Chen | A47B 88/49 |
| | | | | 312/334.4 |
| 8,848,378 | B2* | 9/2014 | Liao | H05K 7/1489 |
| | | | | 361/727 |
| 9,010,703 | B2* | 4/2015 | Tresserras Picas | B23P 19/04 |
| | | | | 248/218.4 |
| 9,723,924 | B1* | 8/2017 | Chiu | A47B 88/407 |
| 9,848,703 | B2* | 12/2017 | Chen | A47B 96/067 |
| 10,292,301 | B1* | 5/2019 | Chen | H05K 7/1491 |
| 10,356,936 | B1* | 7/2019 | Ivey | H05K 7/183 |
| 10,645,826 | B1* | 5/2020 | Chen | H05K 5/0208 |
| 10,687,437 | B2* | 6/2020 | Chen | H05K 7/183 |
| 11,058,221 | B2* | 7/2021 | Charest | A47B 88/53 |
| 2002/0131242 | A1* | 9/2002 | Nagasawa | G11B 33/125 |
| | | | | 361/727 |
| 2003/0107309 | A1* | 6/2003 | Lauchner | A47B 88/43 |
| | | | | 312/334.5 |
| 2009/0072690 | A1* | 3/2009 | Bubolz | A47B 88/43 |
| | | | | 312/334.5 |
| 2015/0115120 | A1* | 4/2015 | Yu | H05K 7/1487 |
| | | | | 248/288.11 |

* cited by examiner

FIXING BRACKET FOR SLIDE RAIL OF OPEN RACK

BACKGROUND

Technical Field

The present disclosure relates to a fixing bracket structure used for fixing a slide rail of a chassis onto an open rack. More particularly, the present disclosure relates to the fixing bracket structure with an adjustable width corresponding to the open rack, so that the slide rail can be fixed on both opposite sides of the open rack to improve the stability of the fixation.

Description of Related Art

In general, an enclosed computer cabinet structure is used for fixing industrial computer chassis. Due to the limitation of spaces, there is a design an open rack which is a rectangular enclosed frame structure disposed vertically on a ground, and the appearance of the open rack has a front view looking like a door frame, and a plurality of ladder pieces or a plurality of mounting holes equidistantly formed on two opposite sides of a framework of the open rack and provided for shelving the chassis and locking a lug at the front of the chassis, so that the chassis can be stacked and arranged vertically.

In recent years, related manufacturers have added a slide rail structure to both sides of the chassis for the convenience of maintenance, and such open rack design is limited to a one-sided fixation, particularly the fixation to the front and bottom of the chassis only, and other parts of the chassis remain suspended outside the open rack. When the chassis is pulled out or pushed in, the movement is very unstable due to the center of gravity, and the whole open rack may even fall backward. Furthermore, most ladder pieces are designed and arranged equidistantly, so that the conventional slide rail structure is good for chassis with a fixed size only, and these ladder pieces definitely occupy certain volume, so that gaps exist and the slide rail structure cannot be attached closely after installation. This is also the main reason why more chassis cannot be installed in the same limited space. What is more, a lug used for the fixation is often installed at the front of the chassis, and thus incurring a higher manufacturing cost.

As disclosed in R.O.C. Utility Model No. 447826 entitled "Improved industrial computer architecture, several chassis can be arranged vertically on a rack, wherein both sides of the rack have slide rails, and both sides of the slide rails have a corresponding embedding elements fixed to fasteners which are on both sides of the chassis, so that the chassis can be engaged to the rack by using the embedding elements and the fasteners abutting against the embedding elements, and the space required for installing the chassis can be reduced. Relatively speaking, the gap will become smaller, and the center of gravity of the chassis can be set on the open rack to achieve better stability. However, the above two methods used for fixing the chassis still have the following drawbacks. The chassis can be fixed on a side of the open rack only or the slide rail is fixed by using a plurality of fasteners as disclosed in R.O.C. Utility Model No. 447826, but each fastener requires a corresponding embedding element for its use, and thus it also incurs a higher manufacturing cost. Furthermore, it is indeed doubtful to simply rely on the slide rail for the strength to support the chassis and definitely requires further improvements.

In view of the aforementioned drawbacks of the conventional open rack, the discloser of this disclosure based on years of experience in the related industry to conduct extensive research and experiment, and focused on the characteristics of using the slide rail, and finally developed a fixing bracket for a slide rail of an open rack capable of adjusting the fixing position freely and making adjustments according to the width of different chassis, and provided a unique design to improve the convenience of installation and removal and the stability of the fixation.

SUMMARY

Therefore, it is a primary objective of the present disclosure to provide a fixing bracket for a slide rail of an open rack comprising a fixed cover and a sliding cover sandwiched between two opposite sides of the open rack, wherein the sliding cover has the flexibility of limiting and adjusting positions, the width between the fixed cover and the sliding cover can be varied to fit the width of the open rack, so as to achieve the effects of facilitating installation and removal, and clamping and fixing the covers from both sides to improve the stability of the fixation. To increase the strength of the slide rail when it is pulled, this disclosure also provides a reinforcing cover covered onto a surface of the slide rail for reinforcement.

To achieve the aforementioned and other objectives, the present disclosure discloses a fixing bracket for a slide rail of an open rack, wherein the slide rail has a fixed rail and at least one moving rail, and the fixed rail has a plurality of fixing holes formed on a surface thereof for covering and fixing the fixing bracket onto the exterior of the fixed rail, and a pair of slide rails are respectively and symmetrically installed on two sides of a chassis, and the fixing bracket is provided for fixing the chassis onto the open rack, wherein the open rack is a rectangular enclosed frame structure disposed vertically on a ground, and two opposite sides of the open rack have a plurality of equidistant mounting holes, and each of the fixing brackets comprises:

a fixed cover, in a shape corresponding to the fixed rail and formed into a C-shaped structure, and provided for being covered and fixed onto the exterior of the fixed rail, and a first fixing plate being disposed on a surface of the fixed cover and configured to be corresponsive to the open rack, and the first fixing plate having a plurality of first through holes formed thereon and configured to be corresponsive to the mounting holes respectively;

a sliding cover, in a shape corresponding to the fixed rail and formed in a C-shaped structure and provided for being slidably covered onto the exterior of the fixed rail, and a second fixing plate being installed on a surface of the sliding cover and configured to be corresponsive to the open rack, and the second fixing plate having a plurality of second through holes formed thereon and configured to be corresponsive to the mounting holes respectively, and a plurality of fasteners, passing through the first through holes and the corresponding mounting holes thereof, and then passing through the second through hole and the corresponding mounting holes thereof for a fixation, so that the sliding design of the sliding cover allows an adjustment according to the width of the open rack, and finally the fasteners are used to fix the first fixing plate and the second fixing plate to two opposite sides relative to the open rack to improve the convenience of installation and removal and the stability of fixation.

In an embodiment of this disclosure, the fixing bracket for a slide rail of an open rack further comprises a pair of limiters, and two limit holes respectively formed on planes of both sides of the sliding cover opposite to the second fixing plate, and the two limiters passing through the two limit holes and being fixed to a surface of the fixed rail, so that the sliding cover is formed in a manner that can slide limitedly at the exterior of the fixed rail. In addition, each of the limiters has an end configured to be corresponding to the fixed rail and formed into a threaded structure, and the other end formed into a cap structure slightly bigger than the limit hole, so that the sliding cover can be adjusted more smoothly and will not fall off easily.

In another embodiment of this disclosure, the fixing bracket for a slide rail of an open rack further comprises a reinforcing cover in a shape corresponding to the fixed rail and covered and fixed onto a surface of the fixed rail, and disposed with a space from a side of the fixed cover or the sliding cover, so that the using strength of the fixed rail can be improved significantly. In addition, the fixed cover, the sliding cover and the reinforcing cover are integrally formed by metal stamping to lower the manufacturing cost.

BRIEF DESCRIPTION OF THE DRAWINGS

The accompanying drawings are included to provide a further understanding of the disclosure, and are incorporated in and constitute a part of this specification. The drawings illustrate embodiments of the disclosure, and together with the description, serve to explain the principles of the disclosure.

DESCRIPTION OF THE EMBODIMENTS

Figure 1:
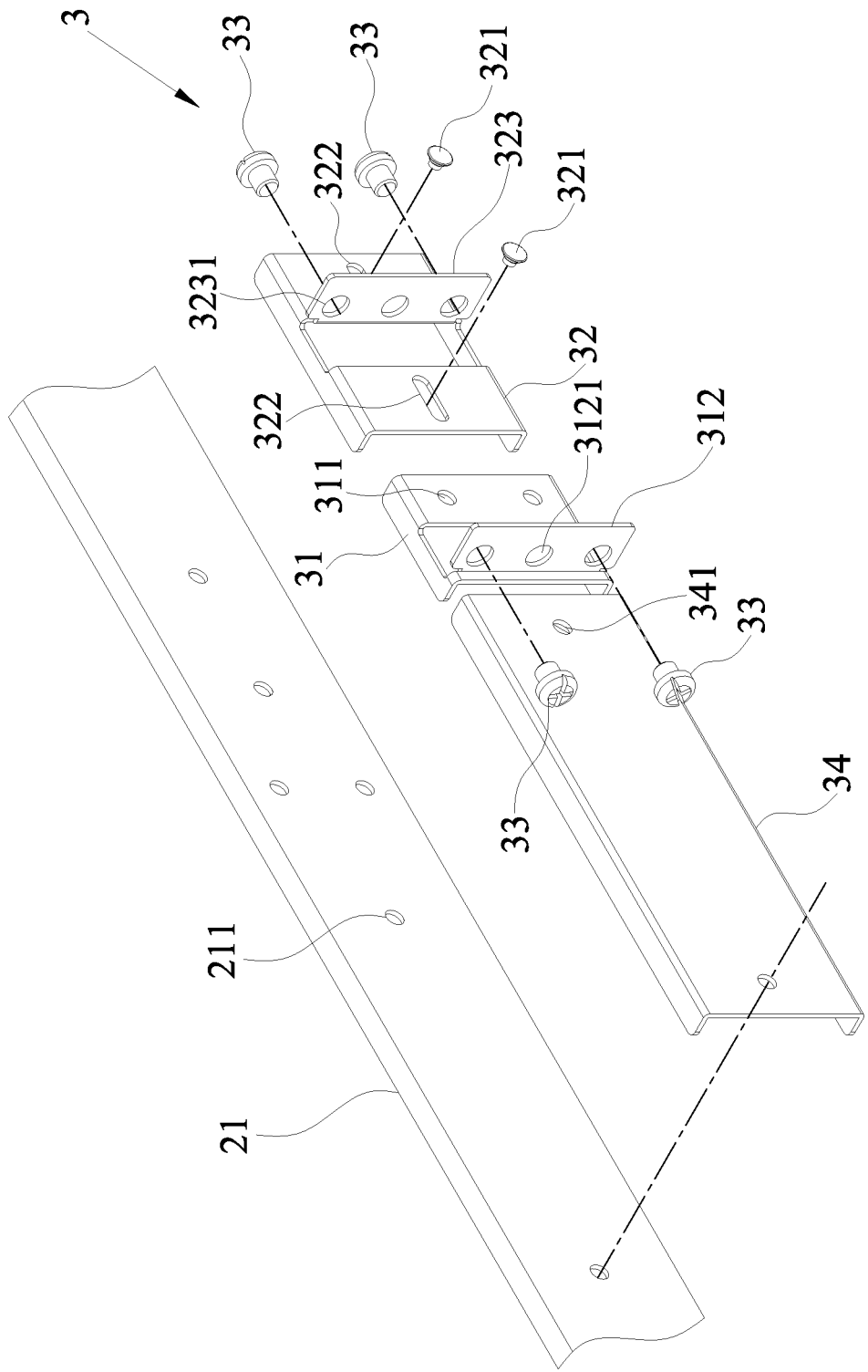
FIG. 1 is an exploded view of a preferred embodiment of this disclosure.
Figure 2:
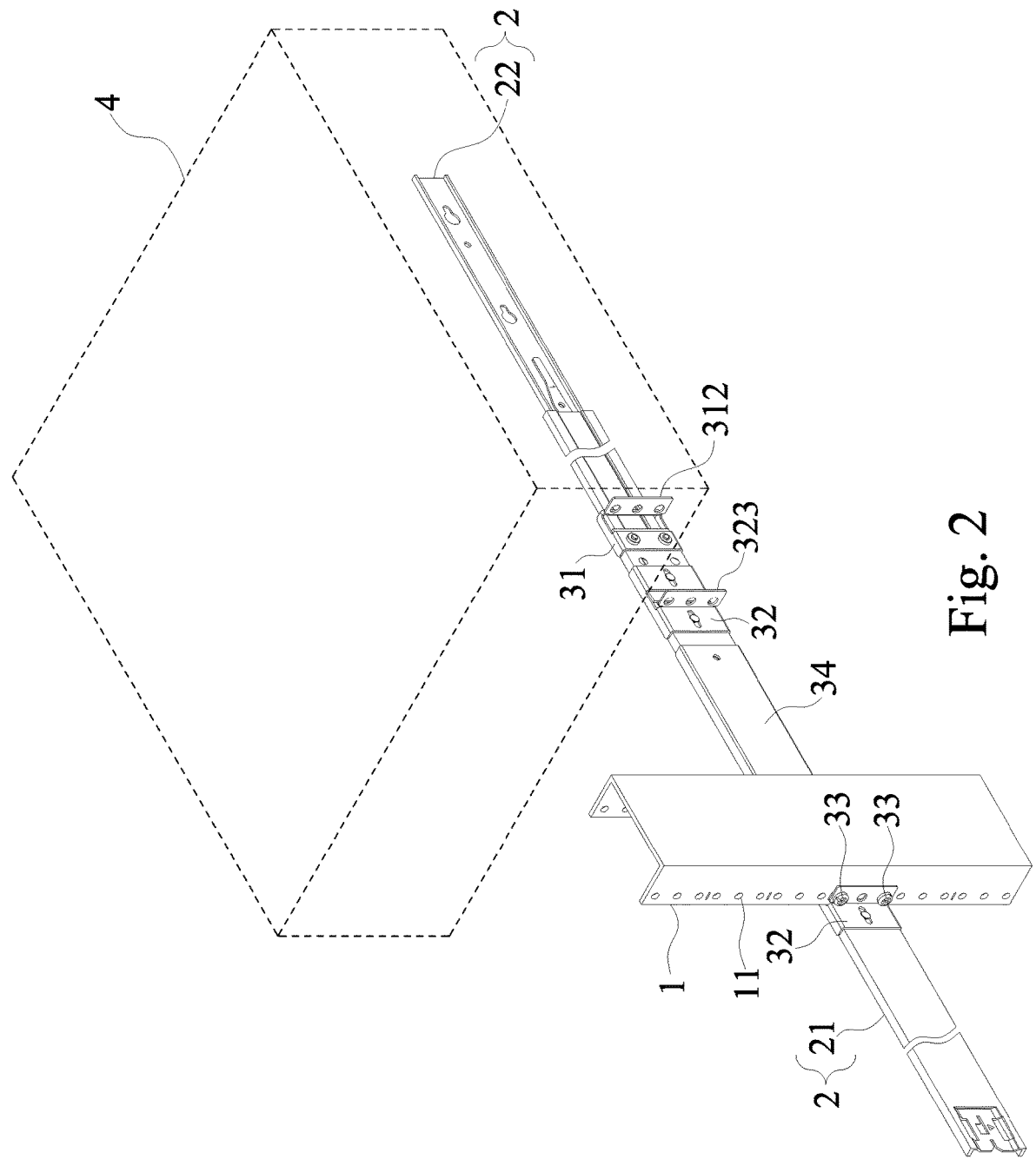
FIG. 2 is a schematic view of a preferred embodiment of this disclosure.

Reference will now be made in detail to the present embodiments of the disclosure, examples of which are illustrated in the accompanying drawings. Wherever possible, the same reference numbers are used in the drawings and the description to refer to the same or like parts.

With reference to FIGS. 1 to 4 for an exploded view, a schematic structural view, and schematic views showing different configurations of installation in accordance to a preferred embodiment of this disclosure respectively, this disclosure discloses a fixing bracket 3 designated for a slide rail 2 of an open rack 1, wherein the slide rail 2 has a fixed rail 21 and at least one moving rail 22, and the fixed rail 21 has a plurality of fixing holes 211 formed on a surface thereof and provided for covering and fixing the fixing bracket 3 onto the exterior of the fixed rail, and a pair of the slide rails 2 are respectively and symmetrically installed on two sides of a chassis 4, and the fixing bracket 3 is provided for fixing the chassis 4 onto the open rack 1, wherein the open rack 1 is a rectangular enclosed frame structure disposed vertically on a ground, and the two opposite sides of the open rack 1 have a plurality of equidistant mounting holes 11, and each of the fixing brackets 3 comprises a fixed cover 31, a sliding cover 32 and a plurality of fasteners 33.

The fixed cover 31 is integrally formed by metal stamping and in a shape corresponding to the fixed rail 21 and formed into a C-shaped structure which is provided for being covered and fixed onto the exterior of the fixed rail 21, and the fixation is primarily achieved by using screws, so that the fixed cover 31 has a plurality of first locking holes 311 formed on a surface thereof and configured to be corresponsive to the fixing holes 211 respectively. In addition, the fixed cover 31 has a first fixing plate 312 disposed vertically on a surface thereof and configured to be corresponsive to the open rack 1 and the first fixing plate 312 has a plurality of first through holes 3121 formed thereon and configured to be corresponsive to the mounting holes 11 in order to fix a chassis onto the open rack 1.

The sliding cover 32 is also integrally formed by metal stamping and has a shape corresponding to the fixed rail 21 and formed into a C-shaped structure, and slidably covered onto the exterior of the fixed rail 21 by using a pair of limiters 321, and the sliding cover 321 has two limit holes 322 formed on a plane thereof and provided for fixing the sliding cover 32 to a surface of the fixed rail 21, so that the sliding cover 32 is formed in a manner that can slide limitedly at the exterior of the fixed rail 21, and each of the limiters 321 has an end formed into a threaded structure and configured to be corresponding to the fixed rail 21, and the other end formed into a cap structure slightly bigger than the limit hole 322 to achieve the effect of preventing the limiters 321 from falling off. In addition, the sliding cover 32 has a second fixing plate 323 installed to a surface thereof and configured to be corresponsive to the open rack 1, and the second fixing plate 323 has a plurality of second through holes 3231 formed thereon and configured to be corresponsive to the mounting holes 11 respectively. It is noteworthy that the two limit holes 322 are formed on both sides of the second fixing plate 323 respectively.

Figure 3:
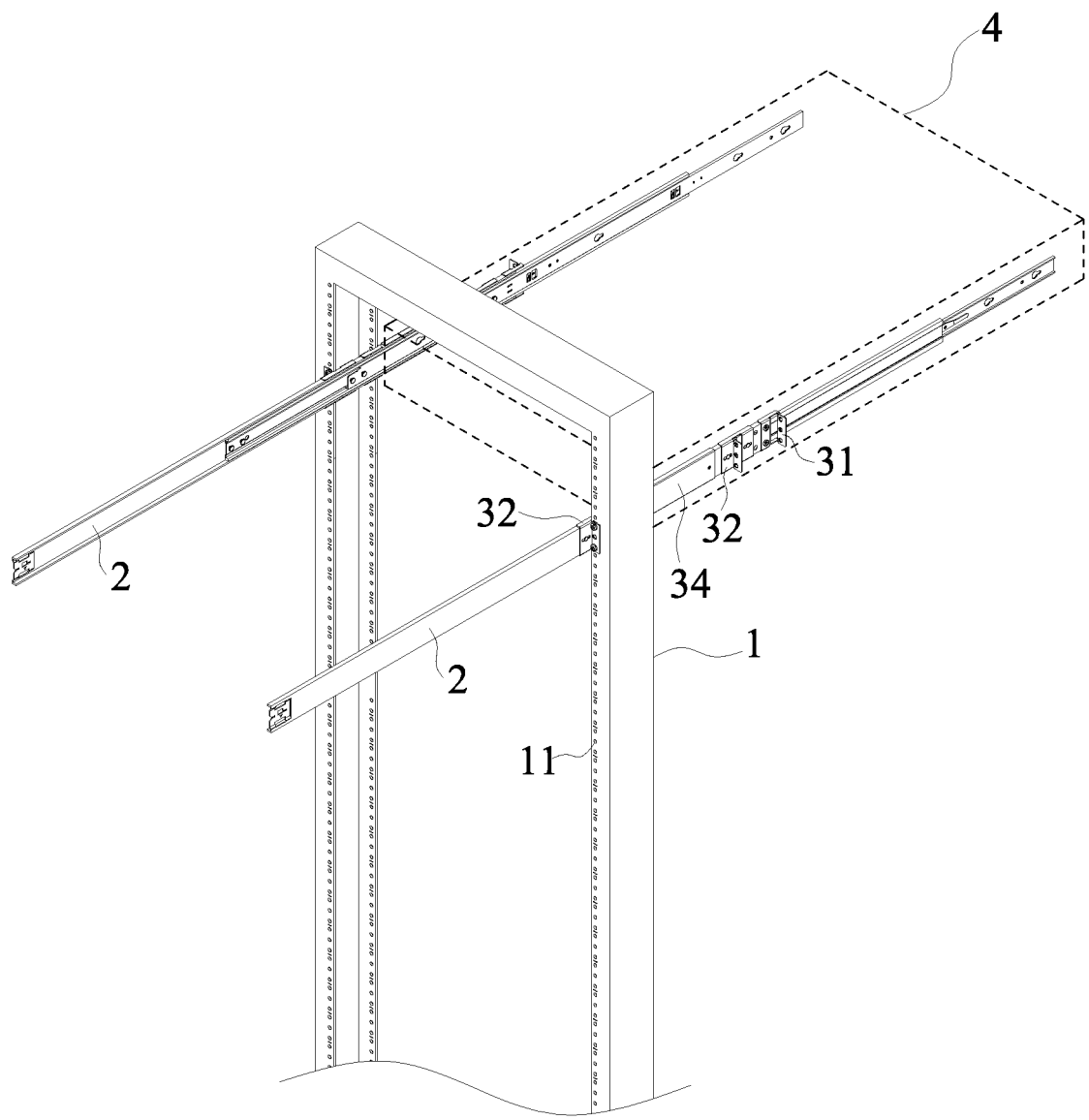
FIG. 3 is a first schematic view showing the configuration of a preferred embodiment of this disclosure during installation.
Figure 4:
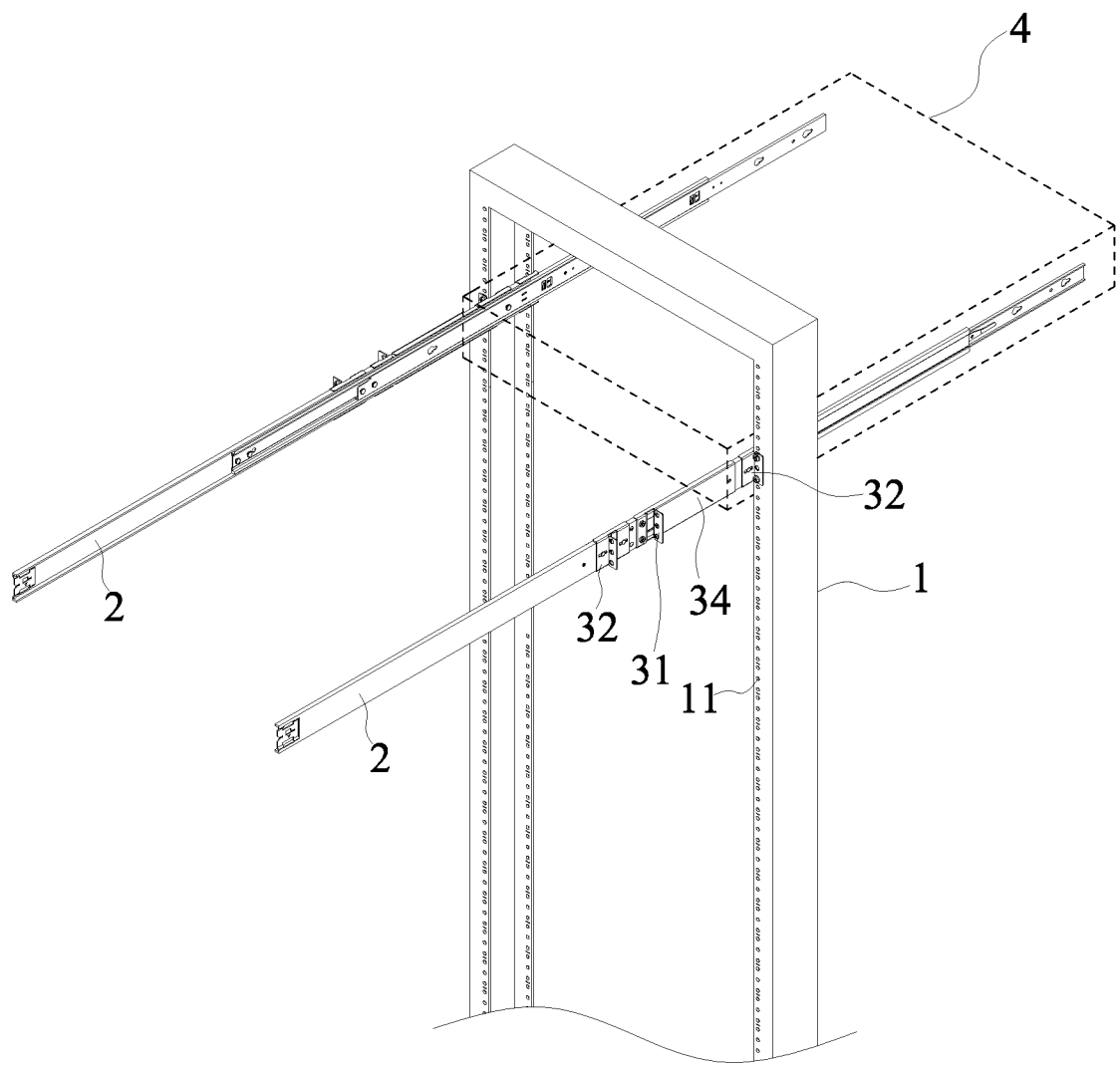
FIG. 4 is a second schematic view showing the configuration of a preferred embodiment of this disclosure during installation.

The fasteners 33 pass through the first through hole 3121 and the corresponding mounting holes 11, and then pass through the second through hole 3231 and the corresponding mounting holes 11 for a fixation. With the sliding design of the sliding cover 32, adjustments can be made according to the width of the open rack 1, and finally the fasteners 33 are used to fix the first fixing plate 312 and the second fixing plate 323 relative to two opposite sides of the open rack 1 to form a two-sided fixing design, so as to increase the force receiving area. In FIGS. 3 and 4, the fixing bracket of this disclosure may be installed at the front or rear of the slide rail 2 to achieve a good support and fixing effect. For on-site construction workers, such arrangement can improve the adaptability to the environment. In other words, the installation position of the fixing bracket can be adjusted according to the environmental requirements.

In addition, the fixing bracket 3 of this disclosure further comprises a plurality of reinforcing covers 34 which are also integrally formed by metal stamping, and it is in a shape corresponding to the fixed rail 21 and provided for being covered and fixed onto a surface of the fixed rail 21, and the reinforcing covers 34 can also be fixed by screws, wherein the surface of the reinforcing cover 34 has a plurality of second locking holes 341 configured to be corresponsive to the corresponding fixing holes 211 respectively. During installation, the reinforcing cover 34 is disposed with a space apart from a side of the fixed cover 31 or the sliding cover 32 to increase the thickness of the fixed rail 21 and improve the using strength effectively.

In summation, the fixing bracket 3 of this disclosure makes use of the sliding cover 32 to provide flexibility of limiting and adjusting the position, so that the width between the fixed cover 31 and the sliding cover 32 can be varied to fit the width of the open rack 1, and the fasteners 33 are provided for locking the fixed cover 31 and the sliding cover 32 to the open rack 1 to define a fixation by sandwiching them between two opposite sides of the open rack 1, and such arrangement not just has the effect of facilitating installation and removal only, but also has the effect of improving the stability of the fixation.

What is claimed is:

1. A fixing bracket for a slide rail of an open rack, wherein the slide rail has a fixed rail and at least one moving rail, and the fixed rail has a plurality of fixing holes formed on a surface thereof for covering and fixing the fixing bracket onto an exterior of the fixed rail, and a pair of the slide rails are respectively and symmetrically installed on two sides of a chassis, and the fixing bracket is provided for fixing the chassis onto the open rack, wherein the open rack is a rectangular enclosed frame structure disposed vertically on a ground, and two opposite sides of the open rack have a plurality of equidistant mounting holes, and the fixing bracket comprises:

- a fixed cover, in a shape corresponding to the fixed rail and having a C-shaped structure, and provided for being covered and fixed onto an exterior of the fixed rail, and a first fixing plate being disposed on a surface of the fixed cover and configured to be corresponsive to the open rack, and the first fixing plate having a plurality of first through holes formed thereon and configured to be corresponsive to the plurality of mounting holes respectively;
- a sliding cover, in a shape corresponding to the fixed rail and formed in a C-shaped structure and provided for being slidably covered onto an exterior of the fixed rail, and a second fixing plate being installed on a surface of the sliding cover and configured to be corresponsive to the open rack, and the second fixing plate having a plurality of second through holes formed thereon and configured to be corresponsive to the plurality of mounting holes respectively, and
- a plurality of fasteners, some of the fasteners are passing through the plurality of first through holes and the corresponding mounting holes thereof, and rest of the fasteners are passing through the plurality of second through holes and the corresponding mounting holes thereof for a fixation, so that the sliding cover allows an adjustment according to a width of the open rack, and finally the plurality of fasteners are used to fix the first fixing plate and the second fixing plate to two opposite sides relative to the open rack to improve convenience of installation and removal and stability of fixation;

wherein two limit holes respectively formed on planes of both sides of the sliding cover opposite to the second fixing plate, and a pair of limiters passing through the two limit holes and being fixed to a surface of the fixed rail, so that the sliding cover is formed in a manner that can slide limitedly at an exterior of the fixed rail;

wherein the limit holes are in a form of slotted hole.

2. The fixing bracket for a slide rail of an open rack as claimed in claim 1, wherein each of the limiters has an end configured to be corresponding to the fixed rail and formed into a threaded structure, and an another end formed into a cap structure slightly bigger than the limit hole.

3. The fixing bracket for a slide rail of an open rack as claimed in claim 2, further comprising a reinforcing cover in a shape corresponding to the fixed rail and covered and fixed onto a surface of the fixed rail, and disposed with a space from a side of the fixed cover or the sliding cover.

4. The fixing bracket for a slide rail of an open rack as claimed in claim 3, wherein the fixed cover, the sliding cover and the reinforcing cover are integrally formed by metal stamping individually.

* * * * *